United States Patent
Yu et al.

(10) Patent No.: US 10,804,178 B2
(45) Date of Patent: Oct. 13, 2020

(54) INTEGRATED CIRCUIT PACKAGE AND METHOD OF FORMING SAME

(71) Applicant: Taiwan Semiconductor Manufacturing Company, Ltd., Hsinchu (TW)

(72) Inventors: Chen-Hua Yu, Hsinchu (TW); Chih-Wei Wu, Zhuangwei Township (TW); Ying-Ching Shih, Hsinchu (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/697,898

(22) Filed: Nov. 27, 2019

(65) Prior Publication Data

US 2020/0135605 A1 Apr. 30, 2020

Related U.S. Application Data

(63) Continuation of application No. 16/176,008, filed on Oct. 31, 2018, now Pat. No. 10,529,637.

(51) Int. Cl.
*H01L 23/31* (2006.01)
*H01L 25/065* (2006.01)
(Continued)

(52) U.S. Cl.
CPC .......... *H01L 23/3135* (2013.01); *H01L 21/56* (2013.01); *H01L 23/18* (2013.01);
(Continued)

(58) Field of Classification Search
CPC . H01L 21/563; H01L 21/568; H01L 21/8221; H01L 23/3135; H01L 25/117
See application file for complete search history.

(56) References Cited

U.S. PATENT DOCUMENTS 3,706,840 A 12/1972 Moyle et al.
7,683,468 B2 3/2010 Haba et al.
(Continued)

FOREIGN PATENT DOCUMENTS

KR 20110000138 A 1/2011
KR 20180094667 A 8/2018
(Continued)

OTHER PUBLICATIONS

Gagnon, P. et al., "Thermo-Compression Bonding and Mass Reflow Assembly Processes of 3D Logic Die Stacks," 2017 IEEE 67th Electronic Components and Technology Conference (ECTC), Orlando, FL, 2017, pp. 116-122.
(Continued)

*Primary Examiner* — George R Fourson, III
(74) *Attorney, Agent, or Firm* — Slater Matsil, LLP

(57) ABSTRACT

An integrated circuit package and a method of forming the same are provided. A method includes stacking a plurality of integrated circuit dies on a wafer to form a die stack. A bonding process is performed on the die stack. The bonding process mechanically and electrically connects adjacent integrated circuit dies of the die stack to each other. A dam structure is formed over the wafer. The dam structure surrounds the die stack. A first encapsulant is formed over the wafer and between the die stack and the dam structure. The first encapsulant fills gaps between the adjacent integrated circuit dies of the die stack. A second encapsulant is formed over the wafer. The second encapsulant surrounds the die stack, the first encapsulant and the dam structure.

20 Claims, 12 Drawing Sheets

(51) Int. Cl.
    *H01L 21/56*    (2006.01)
    *H01L 25/00*    (2006.01)
    *H01L 23/18*    (2006.01)
    *H01L 21/822*    (2006.01)
    *H01L 25/11*    (2006.01)

(52) U.S. Cl.
    CPC .......... *H01L 25/0657* (2013.01); *H01L 25/50* (2013.01); *H01L 21/563* (2013.01); *H01L 21/568* (2013.01); *H01L 21/8221* (2013.01); *H01L 25/117* (2013.01); *H01L 2225/06513* (2013.01)

(56) References Cited

U.S. PATENT DOCUMENTS

| | | | |
|---|---|---|---|
| 9,397,078 | B1 | 7/2016 | Chandolu et al. |
| 9,966,278 | B1 | 5/2018 | Kim et al. |
| 10,157,888 | B1 | 12/2018 | Lin et al. |
| 10,170,341 | B1 | 1/2019 | Lin et al. |
| 10,504,824 | B1 * | 12/2019 | Pan .................. H01L 24/97 |
| 2007/0164457 | A1 | 7/2007 | Yamaguchi et al. |
| 2008/0017994 | A1 | 1/2008 | Do et al. |
| 2010/0304536 | A1 | 12/2010 | Sumita |
| 2011/0074015 | A1 | 3/2011 | Suzuki |
| 2011/0147911 | A1 | 6/2011 | Kohl et al. |
| 2013/0009298 | A1 | 1/2013 | Ota et al. |
| 2013/0240909 | A1 | 9/2013 | Hiramatsu et al. |
| 2014/0035137 | A1 | 2/2014 | Kwon et al. |
| 2014/0103536 | A1 | 4/2014 | Yokoyama et al. |
| 2014/0110836 | A1 | 4/2014 | Tsai et al. |
| 2015/0130072 | A1 | 5/2015 | Wu et al. |
| 2016/0013115 | A1 | 1/2016 | Vadhavkar et al. |
| 2016/0013173 | A1 | 1/2016 | Vadhavkar et al. |
| 2017/0263837 | A1 * | 9/2017 | Jeon ..................... H01L 33/505 |
| 2018/0012865 | A1 | 1/2018 | Schrock |
| 2018/0190560 | A1 * | 7/2018 | Li ........................ H01L 25/0655 |
| 2018/0286824 | A1 | 10/2018 | Jeng et al. |
| 2018/0342466 | A1 | 11/2018 | Lin et al. |

FOREIGN PATENT DOCUMENTS

| | | |
|---|---|---|
| TW | 201417223 A | 5/2014 |
| TW | 201519404 A | 5/2015 |
| TW | 201838127 A | 10/2018 |

OTHER PUBLICATIONS

Khan et al., "Three Chips Stacking With Low Volume Solder Using Single Re-Flow Process," 2010 Proceedings 60th Electronic Components and Technology Conference (ECTC), Las Vegas, NV, 2010, pp. 884-888.

Lau, J., "Status and Outlooks of Flip Chip Technology," Materials Science, Feb. 2017, pp. 1-16.

* cited by examiner

INTEGRATED CIRCUIT PACKAGE AND METHOD OF FORMING SAME

PRIORITY CLAIM AND CROSS-REFERENCE

This application is a continuation and claims the benefit of U.S. patent application Ser. No. 16/176,008, filed on Oct. 31, 2018, which application is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DICs where dies are packaged and are then packaged together with another packaged die or dies. Chip-on-package (COP) devices are another type of 3DICs where dies are packaged and are then packaged together with another die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
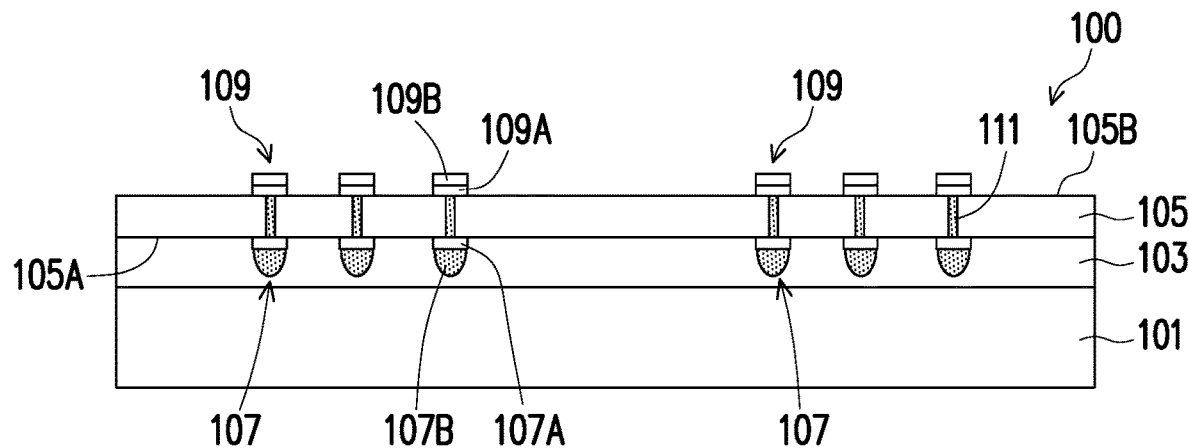
FIGS. 1-4, 5A, 5B, and 6-11 illustrate top and cross-sectional views of various processing steps during fabrication of integrated circuit packages in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely an integrated circuit package and a method of forming the same. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, or the like, or mounting input components, boards, dies or other components, or for connection packaging or mounting combinations of any type of integrated circuit or electrical component. Various embodiments described herein allow for forming integrated circuit packages by arranging integrated circuit dies into a die stack and bonding the adjacent integrated circuit dies of the die stack to one another using a single bonding process applied to the die stack, without applying an additional external force on the die stack during the bonding process. Various embodiments described herein further allow for forming an encapsulant material in gaps between adjacent integrated circuit dies without forming voids in the encapsulant material and allow for improving the gap-filling performance of the encapsulant material. Various embodiments described herein further allow for reducing wafer warpage during the formation of the integrated circuit packages.

Figure 8:
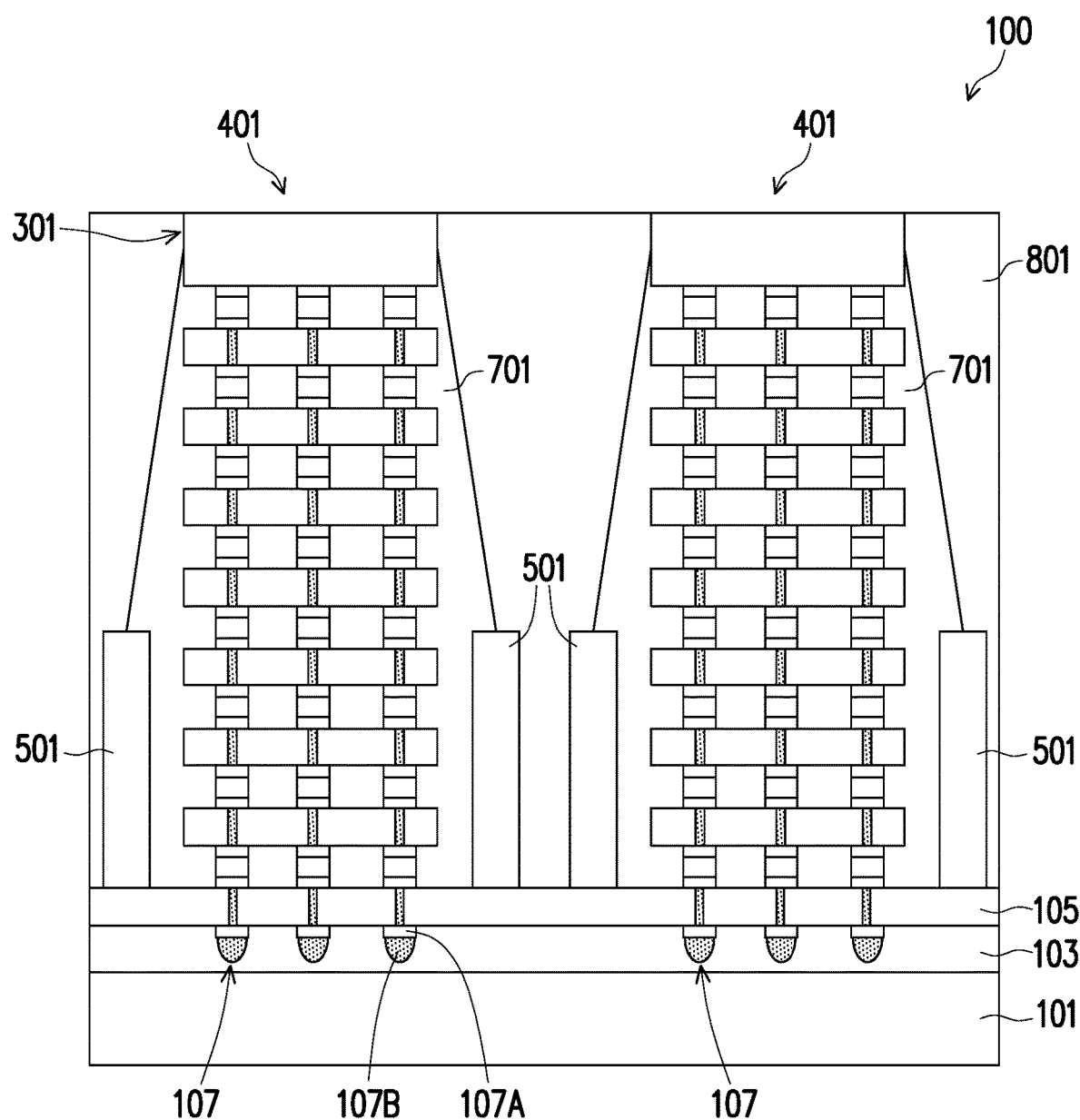
Figure 9:
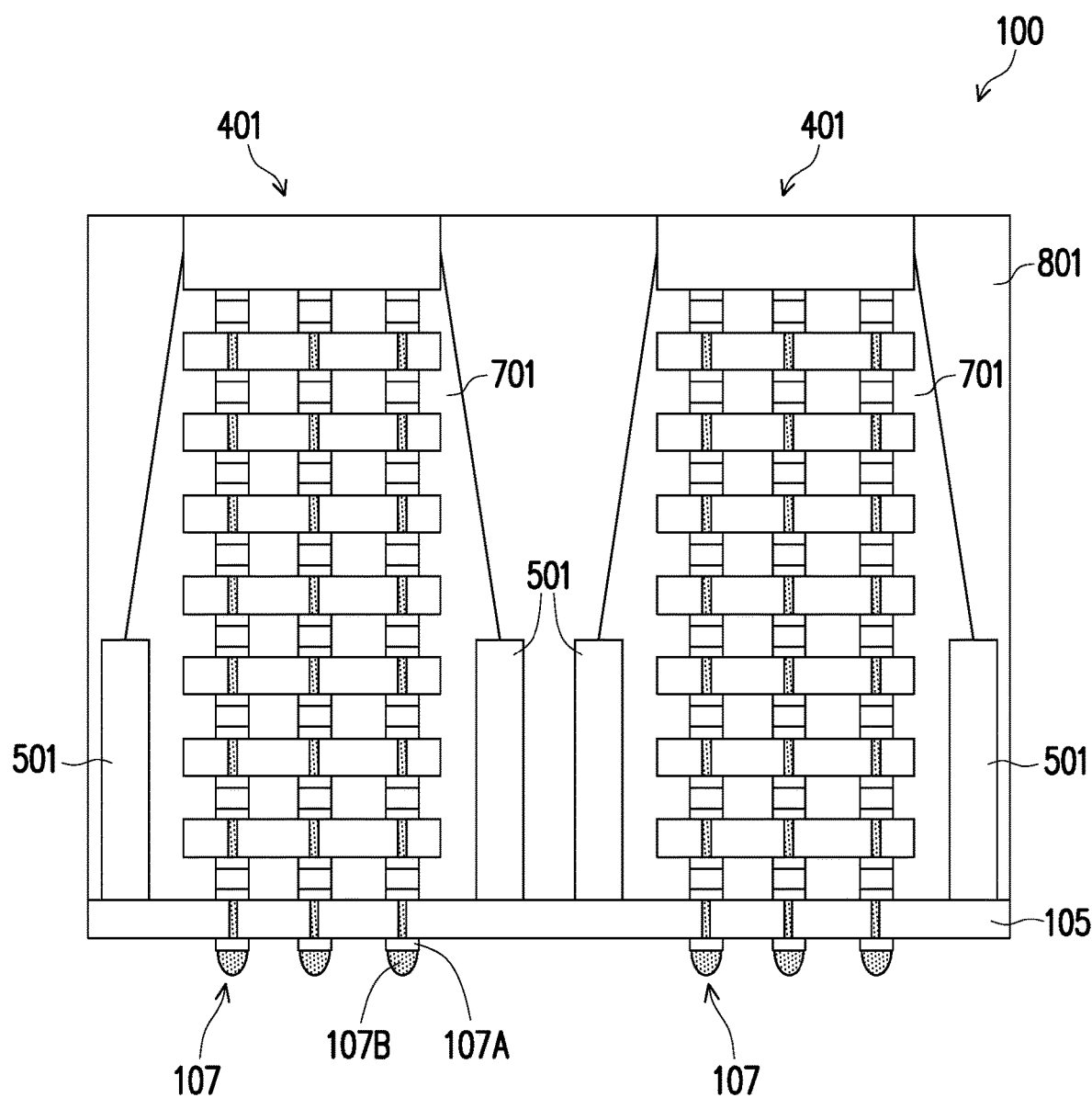
Figure 10:
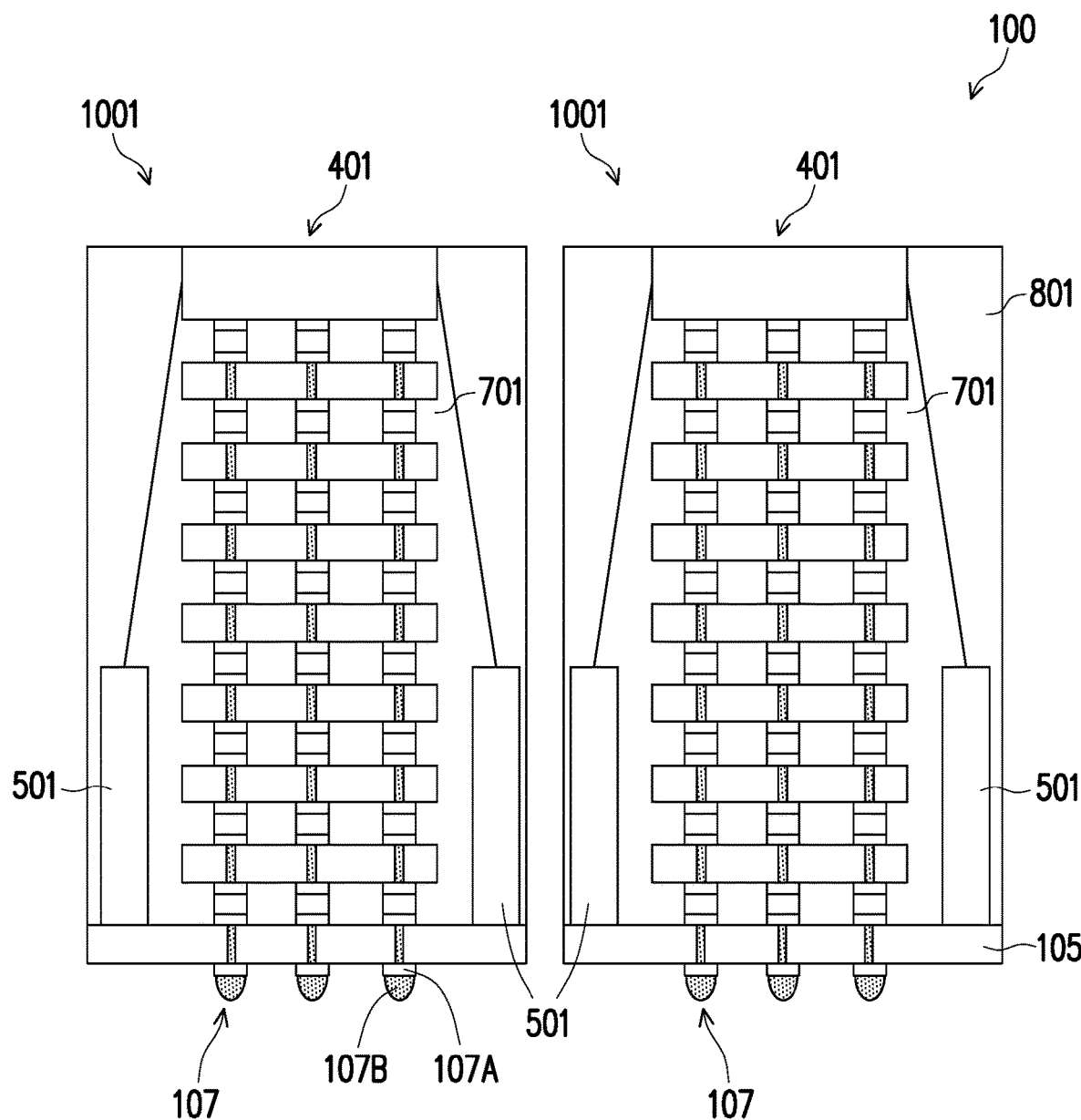

FIGS. 1-4, 5A, 5B, and 6-11 illustrate top and cross-sectional views of various processing steps during fabrication of integrated circuit (IC) packages in accordance with some embodiments (such as, for example, IC packages 1001 illustrated in FIG. 10). Referring to FIG. 1, the process starts with bonding a wafer 105 to a carrier 101 to start forming a wafer-level die structure 100. In some embodiments, the wafer 105 is attached to the carrier 101 using an adhesive layer 103. In some embodiments, the carrier 101 may comprise silicon, quartz, ceramic, glass, a combination thereof, or the like, and provides mechanical support for subsequent operations performed on the wafer 105. In some embodiments, the adhesive layer 103 may comprise a light to heat conversion (LTHC) material, a UV adhesive, a polymer layer, a combination thereof, or the like, and may be formed using a spin-on coating process, a printing process, a lamination process, a combination thereof, or the like. In some embodiments where the adhesive layer 103 is formed of a LTHC material, the adhesive layer 103 when exposed to light partially or fully loses its adhesive strength and the carrier 101 can be easily removed from a back side of the wafer-level die structure 100 after the formation of the wafer-level die structure 100 is completed.

In some embodiments, the wafer 105 comprises a substrate (not individually shown), one or more active and/or passive devices (not individually shown) on the substrate, and an interconnect structure (not individually shown) over the one or more active and/or passive devices and the substrate. In some embodiments, the substrate may be formed of silicon, although it may also be formed of other group III, group IV, and/or group V elements, such as silicon, germanium, gallium, arsenic, and combinations thereof. The substrate may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

In some embodiments, the wafer 105 further includes one or more active and/or passive devices (not individually shown) formed on the substrate. The one or more active and/or passive devices may include various n-type metal-oxide semiconductor (NMOS) and/or p-type metal-oxide semiconductor (PMOS) devices such as transistors, capacitors, resistors, diodes, photo-diodes, fuses and/or the like.

In some embodiments, the wafer 105 further includes an interconnect structure (not individually shown) formed over the substrate and the one or more active and/or passive devices. The interconnect structure may comprise a plurality of dielectric layers (such an inter-layer dielectric (ILD)/inter-metal dielectric layers (IMDs)) and interconnects (such as conductive lines and vias) within the dielectric layers. The dielectric layers may be formed, for example, of a low-K dielectric material, such as phosphosilicate glass (PSG), borophosphosilicate glass (BPSG), FSG, SiOxCy, Spin-On-Glass, Spin-On-Polymers, silicon carbon material, compounds thereof, composites thereof, combinations thereof, or the like, by any suitable method known in the art, such as a spin-on coating method, chemical vapor deposition (CVD), plasma enhanced CVD (PECVD), a combination thereof, or the like. In some embodiments, interconnects may be formed in the dielectric layers using, for example, a damascene process, a dual damascene process, a combination thereof, or the like. In some embodiments, interconnects may comprise copper, a copper alloy, silver, gold, tungsten, tantalum, aluminum, a combination thereof, or the like. In some embodiments, the interconnects may provide electrical connections between the one or more active and/or passive devices formed on the substrate.

In some embodiments, the wafer 105 further includes through vias (TVs) 111 that extend from a first surface 105A of the wafer 105 toward a second surface 105B of the wafer 105. In some embodiments, the TVs 111 may be formed by forming openings in the wafer 105 and filling the openings with suitable conductive materials. In some embodiments, the openings may be formed using suitable photolithography and etching methods. In some embodiments, the openings may be filled with copper, a copper alloy, silver, gold, tungsten, tantalum, aluminum, a combination thereof, or the like, using physical vapor deposition (PVD), atomic layer deposition (ALD), electro-chemical plating, electroless plating, or a combination thereof, the like. In some embodiments, a liner layer and/or an adhesive/barrier layer may be formed in the openings before filling the openings with suitable conductive materials. In some embodiments, a planarization process may be performed on the conductive material of the TVs 111 to remove excess portions of the conductive material. The planarization process may comprise a chemical mechanical polishing (CMP) process, a grinding process, an etching process, a combination thereof, or the like.

In some embodiments, the wafer 105 further includes connectors 107 formed on the first surface 105A of the wafer 105 and connectors 109 formed on the second surface 105B of the wafer 105. In some embodiments, each of the connectors 107 comprises a conductive pillar bump 107A and a solder element 107B over the conductive pillar bump 107A. In some embodiments, the conductive pillar bumps 107A may comprise a conductive material such as copper, tungsten, aluminum, silver, gold, a combination thereof, or the like. In some embodiments, the solder elements 107B may comprise lead-based solders such as PbSn compositions, lead-free solders including InSb, tin, silver, and copper ("SAC") compositions, and other eutectic materials that have a common melting point and form conductive solder connections in electrical applications. For lead-free solders, SAC solders of varying compositions may be used, such as SAC 105 (Sn 98.5%, Ag 1.0%, Cu 0.5%), SAC 305, and SAC 405, as examples. Lead-free solders also include SnCu compounds, without the use of silver (Ag), and SnAg compounds, without the use of copper (Cu).

In some embodiments, a method of forming the conductive pillar bumps 107A may comprise forming a conductive seed layer over the first surface 105A, forming a sacrificial material (such as, for example, a photoresist material) over the conductive seed layer, patterning the sacrificial material to form openings in the sacrificial layer, depositing a conductive material in the openings using an electro-chemical plating process, an electroless plating process, ALD, PVD, a combination thereof, or the like, removing the sacrificial layer, and removing exposed portions of the conductive seed layer. In some embodiments, before removing the sacrificial layer, a solder material is formed over the conductive material of the conductive pillar bumps 107A in the openings using evaporation, an electro-chemical plating process, an electroless plating process, printing, solder transfer, a combination thereof, or the like to form the solder elements 107B. In some embodiments, a reflow process may be performed on the solder elements 107B in order to shape the solder material into the desired bump shapes. In other embodiments, the connectors 107 may be solder balls, controlled collapse chip connection (C4) bumps, ball grid array (BGA) balls, micro bumps, electroless nickel-electroless palladium-immersion gold technique (ENEPIG) formed bumps, combinations thereof, or the like.

In some embodiments, the connectors 109 may be similar to and may be formed using similar materials and methods as the connectors 107 and the description is not repeated herein. In some embodiments, each of the connectors 109 comprises a conductive pillar bump 109A and a solder element 109B over the conductive pillar bump 109A. In some embodiments, the conductive pillar bumps 109A may be formed using similar materials and methods as the conductive pillar bumps 107A and the description is not repeated herein. In some embodiments, the solder elements 109B may be formed using similar materials and methods as the solder elements 107B and the description is not repeated herein. In some embodiments, no reflow process is performed after the solder elements 109B are formed.

In some embodiment, the wafer 105 may be an interposer wafer. In such embodiments, the wafer 105 may not include the one or more active and/or passive devices on the substrate. In other embodiments, the wafer 105 may be an IC wafer. In such embodiments, the wafer 105 includes the one or more active and/or passive devices on the substrate.

Figure 2:
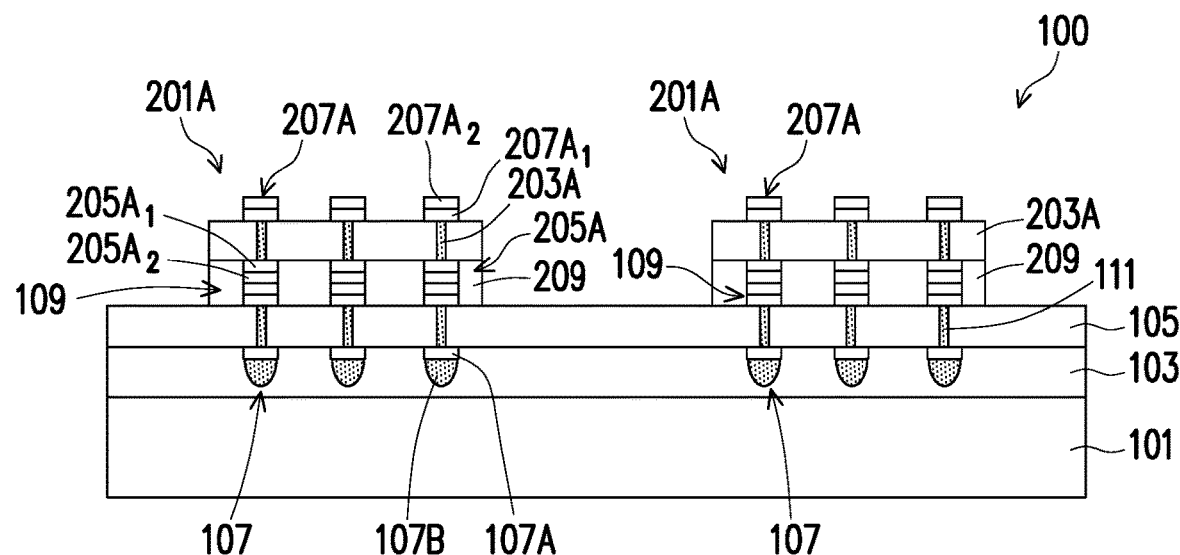

Referring to FIG. 2, IC dies 201A are placed on the wafer 105 to start forming die stacks (such as die stacks 401 illustrated in FIG. 4) on the wafer 105. The IC dies 201A may comprise a logic die, a memory die, a CPU, a GPU, an xPU, a MEMS die, a SoC die, or the like. In some embodiment, each of the IC die 201A may comprise a substrate (not individually illustrated), one or more active and/or passive devices (not individually illustrated) on the substrate, and an interconnect structure (not individually illustrated) over the substrate and the one or more active and/or passive devices. In some embodiments, the substrate of the IC dies 201A may be formed using similar materials and method as the substrate of the wafer 105 described above with reference to FIG. 1 and the description is not repeated herein. In some embodiments, the one or more active and/or passive devices of the IC dies 201A may be formed using similar materials and method as the one or more active and/or passive devices of the wafer 105 described above with reference to FIG. 1 and the description is not repeated herein. In some embodiments, the interconnect structure of the IC dies 201A may be formed using similar materials and method as the interconnect structure of the wafer 105 described above with reference to FIG. 1 and the description is not repeated herein. In some embodiments, the IC dies 201A may have thickness between about 20 μm and about 50 μm.

In some embodiments, each of the IC dies 201A further includes through vias (TVs) 203A that extend from a lower surface of the IC die 201A toward an upper surface of the IC die 201A, connectors 205A on the lower surface of the IC die 201A, and connectors 207A on the upper surface of the IC die 201A. In some embodiments, the TVs 203A may be formed using similar materials and methods as the TVs 111 described above with reference to FIG. 1 and the description is not repeated herein. In some embodiments, the connectors 205A and 207A may be similar to and may be formed using similar materials and methods as the connectors 107 described above with reference to FIG. 1 and the description is not repeated herein. In some embodiments, each of the connectors 205A may comprise a conductive pillar bump $205A_1$ and a solder element $205A_2$ over the conductive pillar bump $205A_1$. In some embodiments, the conductive pillar bumps $205A_1$ may be formed using similar materials and methods as the conductive pillar bumps 107A described above with reference to FIG. 1 and the description is not repeated herein. In some embodiments, the solder elements $205A_2$ may be formed using similar materials and methods as the solder elements 107B described above with reference to FIG. 1 and the description is not repeated herein.

In some embodiments, each of the connectors 207A may comprise a conductive pillar bump $207A_1$ and a solder element $207A_2$ over the conductive pillar bump $207A_1$. In some embodiments, the conductive pillar bumps $207A_1$ may be formed using similar materials and methods as the conductive pillar bumps 107A described above with reference to FIG. 1 and the description is not repeated herein. In some embodiments, the solder elements $207A_2$ may be formed using similar materials and methods as the solder elements 107B described above with reference to FIG. 1 and the description is not repeated herein. In some embodiments, no reflow process is performed after the solder elements $205A_2$ and $207A_2$ are formed.

Referring further to FIG. 2, in some embodiments, the IC dies 201A may be placed on the wafer 105 using a pick-and-place apparatus. In other embodiments, the IC dies 201A may be placed on the wafer 105 manually, or using any other suitable methods. In some embodiments, the IC dies 201A are dipped in a flux material 209 before placing the IC dies 201A on the wafer 105. In some embodiments, the flux material 209 pre-bonds the IC dies 201A to the wafer 105. In some embodiments, the IC dies 201A may be aligned with respect to the connectors 109 of the wafer 105, such that the connectors 205A of the IC dies 201A are placed on the connectors 109 of the wafer 105. In some embodiments, during placing the IC dies 201A on the wafer 105 or after placing the IC dies 201A on the wafer 105 but before placing additional IC dies on the IC dies 201A, no additional external force (such as a force different from the gravitational force due to a weight of the IC dies 201A) is applied to the IC dies 201A. In some embodiments, during placing the IC dies 201A on the wafer 105 or after placing the IC dies 201A on the wafer 105 but before placing additional IC dies on the IC dies 201A, no additional process steps are performed to pre-bond or bond the connectors 205A of the IC dies 201A to the connectors 109 of the wafer 105.

Figure 3:
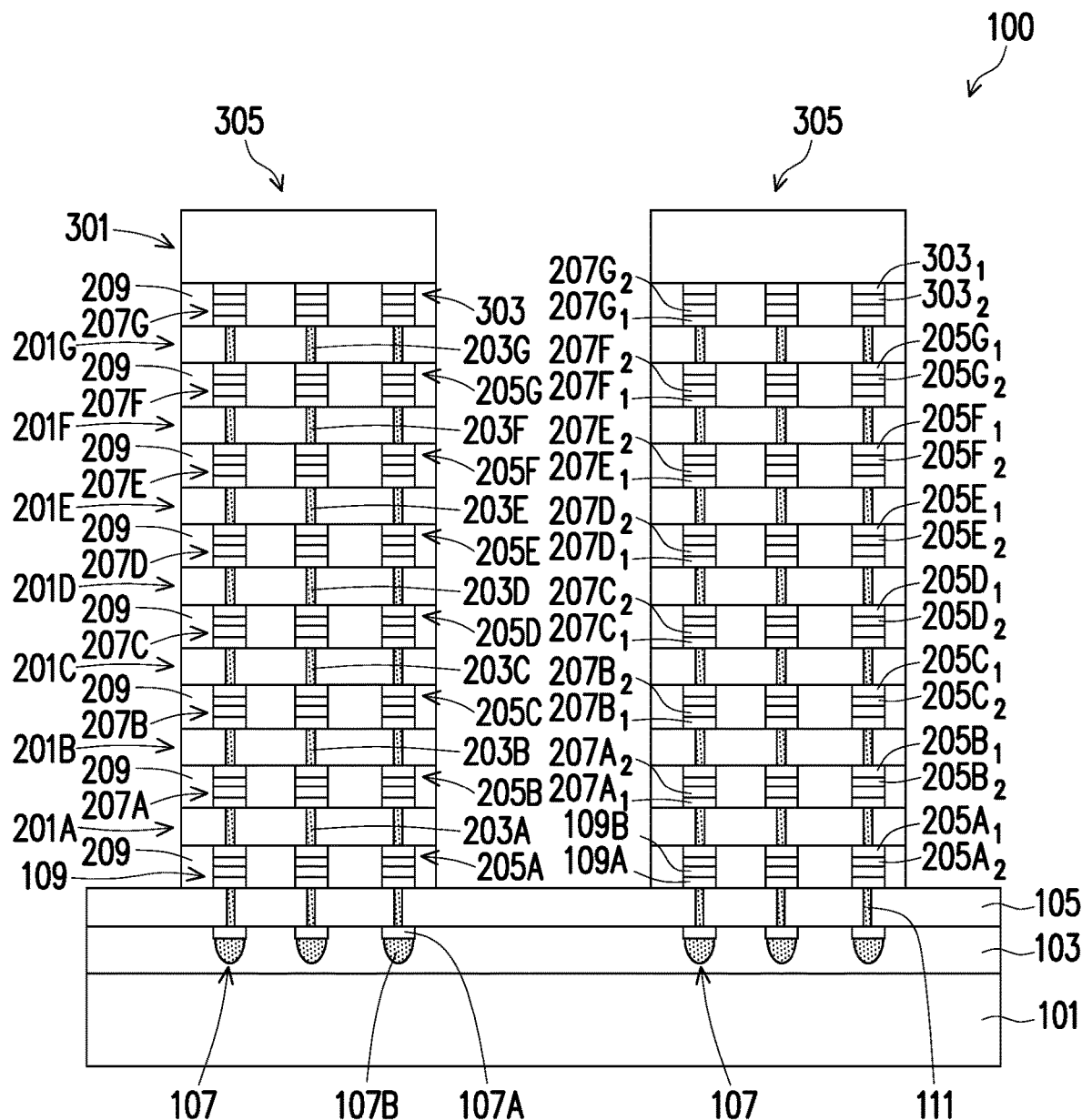

Referring to FIG. 3, IC dies 201B-201G and 301 are placed over the respective IC dies 201A to form pre-bonded die stacks 305 on the wafer 105. In some embodiments, IC dies 201X (with X=B, C, . . . , G) may be similar to the IC dies 201A described above with reference to FIG. 2 and the description is not repeated herein. In some embodiments, each of the IC dies 201X (with X=B, C, . . . , G) further includes through vias (TVs) 203X (with X=B, C, . . . , G) that extend from lower surfaces of the IC dies 201X (with X=B, C, . . . , G) toward upper surfaces of the IC dies 201X (with X=B, C, . . . , G), connectors 205X (with X=B, C, . . . , G) on the lower surfaces of the IC dies 201X (with X=B, C, . . . , G), and connectors 207X (with X=B, C, . . . , G) on the upper surfaces of the IC dies 201X (with X=B, C, . . . , G). Each of the connectors 205X (with X=B, C, . . . , G) comprised a conductive pillar bump $205X_1$ (with X=B, C, . . . , G) and a solder element $205X_2$ (with X=B, C, . . . , G) over the conductive pillar bump $205X_1$ (with X=B, C, . . . , G). In some embodiments, the conductive pillar bumps $205X_1$ (with X=B, C, . . . , G) may be formed using similar materials and methods as the conductive pillar bumps 107A described above with reference to FIG. 1 and the description is not repeated herein. In some embodiments, the solder elements $205X_2$ (with X=B, C, . . . , G) may be formed using similar materials and methods as the solder elements 107B described above with reference to FIG. 1 and the description is not repeated herein. Each of the connectors 207X (with X=B, C, . . . , G) comprises a conductive pillar bump $207X_1$ (with X=B, C, . . . , G) and a solder element $207X_2$ (with X=B, C, . . . , G) over the conductive pillar bump $207X_1$ (with X=B, C, . . . , G). In some embodiments, the conductive pillar bumps $207X_1$ (with X=B, C, . . . , G) may be formed using similar materials and methods as the conductive pillar bumps 107A described above with reference to FIG. 1 and the description is not repeated herein. In some embodiments, the solder elements 207X$_2$ (with X=B, C, . . . , G) may be formed using similar materials and methods as the solder elements 107B described above with reference to FIG. 1 and the description is not repeated herein. In some embodiments, no reflow process is performed after the solder elements 205X$_2$ (with X=B, C, . . . , G) and 207X$_2$ (with X=B, C, . . . , G) are formed. In some embodiments, the IC dies 201X (with X=A, B, C, . . . , G) may have a same thickness. In other embodiments, the IC dies 201X (with X=A, B, C, . . . , G) may have different thicknesses.

In some embodiments, IC dies 301 may be similar to the IC dies 201X (with X=A, B, C, . . . , G) and the description is not repeated herein. In some embodiments, the IC dies 301 have a greater thickness than each of the IC dies 201X (with X=A, B, C, . . . , G). In some embodiments, each of the IC dies 301 further includes connectors 303 on the lower surfaces of the IC dies 301. Each of the connectors 303 comprises a conductive pillar bump 303$_1$ and a solder element 303$_2$ over the conductive pillar bump 303$_1$. In some embodiments, the conductive pillar bumps 303$_1$ may be formed using similar materials and methods as the conductive pillar bumps 107A described above with reference to FIG. 1 and the description is not repeated herein. In some embodiments, the solder elements 303$_2$ may be formed using similar materials and methods as the solder elements 107B described above with reference to FIG. 1 and the description is not repeated herein. In some embodiments, no reflow process is performed on the pre-bonded die stack 305 after the solder elements 303$_2$ are formed.

Referring further to FIG. 3, the IC dies 201X (with X=B, C, . . . , G) and 301 are stacked over the respective IC dies 201A using a method similar to the method of placing IC dies 201A on the wafer 105 described above with reference to FIG. 2 and the description is not repeated herein. In some embodiments, the IC dies 201X (with X=B, C, . . . , G) and 301 are dipped in a flux material 209 before placing them over previous IC dies to form pre-bonded die stacks 305. In some embodiments, the flux material 209 pre-bonds adjacent IC dies (such as IC dies 201A and 201B, IC dies 201B and 201C, IC dies 201C and 201D, IC dies 201D and 201E, IC dies 201E and 201F, IC dies 201F and 201G, and IC dies 201G and 301) of the pre-bonded die stack 305 to form the pre-bonded die stack 305. In some embodiment, during the formation of the pre-bonded die stack 305, no additional external force (such as a force different from the gravitational force due to a weight of the IC dies) is applied to the IC dies (with X=B, C, . . . , G) and 301. In some embodiments, during the formation of the pre-bonded die stack 305, no additional process steps are performed to pre-bond or bond the connectors 207A to the connectors 205B, the connectors 207B to the connectors 205C, the connectors 207C to the connectors 205D, the connectors 207D to the connectors 205E, the connectors 207E to the connectors 205F, the connectors 207F to the connectors 205G, and the connectors 207G to the connectors 303.

Figure 4:
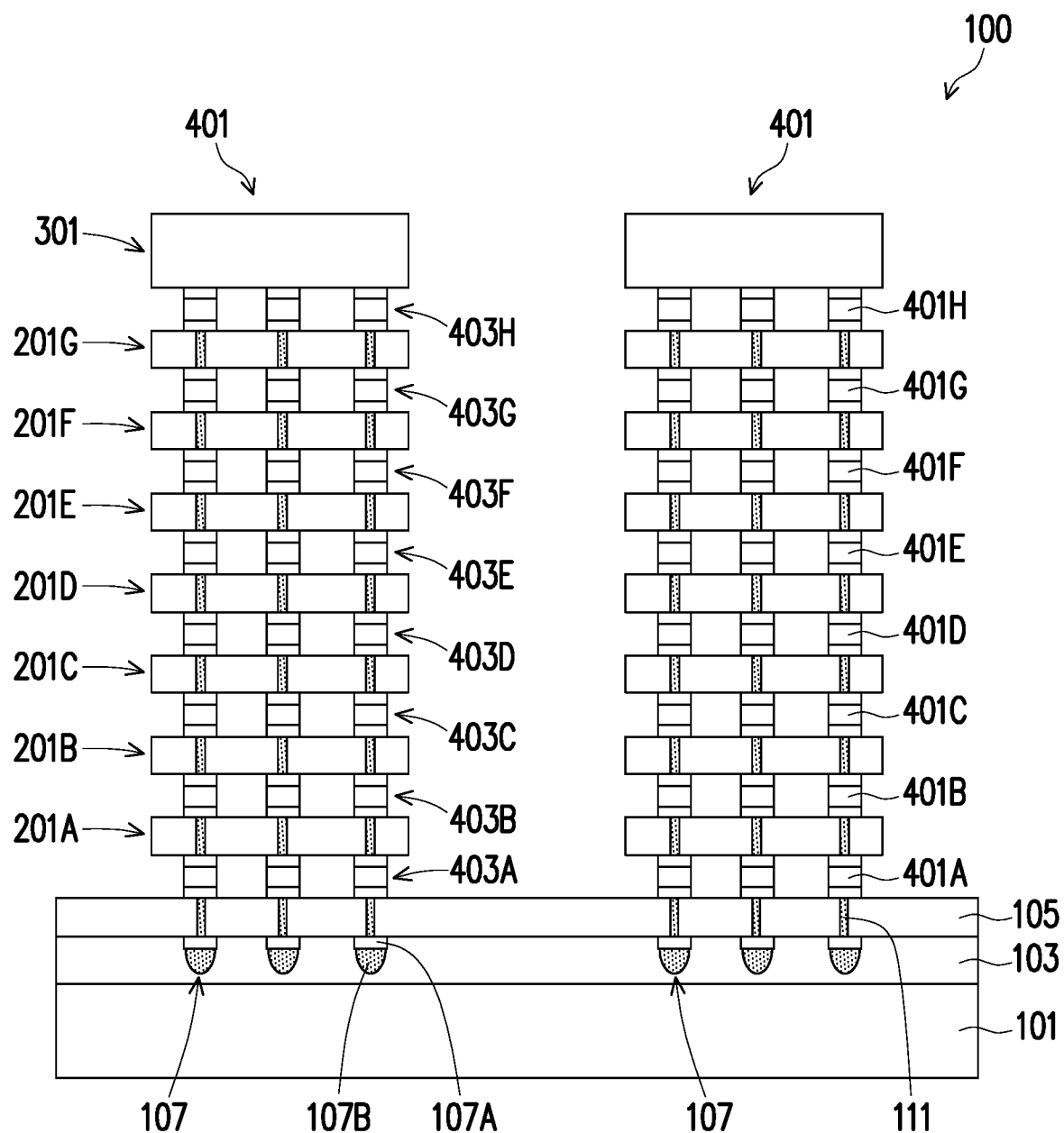

Referring to FIG. 4, a single bonding process is performed on the pre-bonded die stacks 305 (see FIG. 3) to form bonded die stacks 401. The single bonding process bonds each of the connectors 109 (see FIG. 3) to a respective one of the connectors 205A (see FIG. 3) to form connector joints 403A, each of the connectors 207A (see FIG. 3) to a respective one of the connectors 205B (see FIG. 3) to form connector joints 403B, each of the connectors 207B (see FIG. 3) to a respective one of the connectors 205C (see FIG. 3) to form connector joints 403C, each of the connectors 207C (see FIG. 3) to a respective one of the connectors 205D (see FIG. 3) to form connector joints 403D, each of the connectors 207D (see FIG. 3) to a respective one of the connectors 205E (see FIG. 3) to form connector joints 403E, each of the connectors 207E (see FIG. 3) to a respective one of the connectors 205F (see FIG. 3) to form connector joints 403F, each of the connectors 207F (see FIG. 3) to a respective one of the connectors 205G (see FIG. 3) to form connector joints 403G, each of the connectors 207G (see FIG. 3) to a respective one of the connectors 303 (see FIG. 3) to form connector joints 403H. For each of the bonded die stacks 401, the single bonding process mechanically and electrically couples the IC dies 201A-201G and 301 to each other.

In some embodiment, the single bonding process is a solder reflow process. The solder reflow process reflows the solder elements 109B of the connectors 109 (see FIG. 3) and the solder elements 205A$_2$ of the connectors 205A (see FIG. 3) into solder joints 401A of the respective connector joints 403A, the solder elements 207A$_2$ of the connectors 207A (see FIG. 3) and the solder elements 205B$_2$ of the connectors 205B (see FIG. 3) into solder joints 401B of the respective connector joints 403B, the solder elements 207B$_2$ of the connectors 207B (see FIG. 3) and the solder elements 205C$_2$ of the connectors 205C (see FIG. 3) into solder joints 401C of the respective connector joints 403C, the solder elements 207C$_2$ of the connectors 207C (see FIG. 3) and the solder elements 205D$_2$ of the connectors 205D (see FIG. 3) into solder joints 401D of the respective connector joints 403D, the solder elements 207D$_2$ of the connectors 207D (see FIG. 3) and the solder elements 205E$_2$ of the connectors 205E (see FIG. 3) into solder joints 401E of the respective connector joints 403E, the solder elements 207E$_2$ of the connectors 207E (see FIG. 3) and the solder elements 205F$_2$ of the connectors 205F (see FIG. 3) into solder joints 401F of the respective connector joints 403F, the solder elements 207F$_2$ of the connectors 207F (see FIG. 3) and the solder elements 205G$_2$ of the connectors 205G (see FIG. 3) into solder joints 401G of the respective connector joints 403G, and the solder elements 207G$_2$ of the connectors 207G (see FIG. 3) and the solder elements 303$_2$ of the connectors 303 (see FIG. 3) into solder joints 401H of the respective connector joints 403H. In some embodiment, during performing the single bonding process, no additional external force (such as a force different from the gravitational force due to a weight of the IC dies 201A-201G and 301) is applied to the pre-bonded die stacks 305 (see FIG. 3). In other embodiments, the single bonding process is a thermal compression bonding process, or the like. In some embodiments, after forming the connector joints 403A-403H, the flux material 209 (see FIG. 3) is removed using a suitable removal process.

Figure 5A:
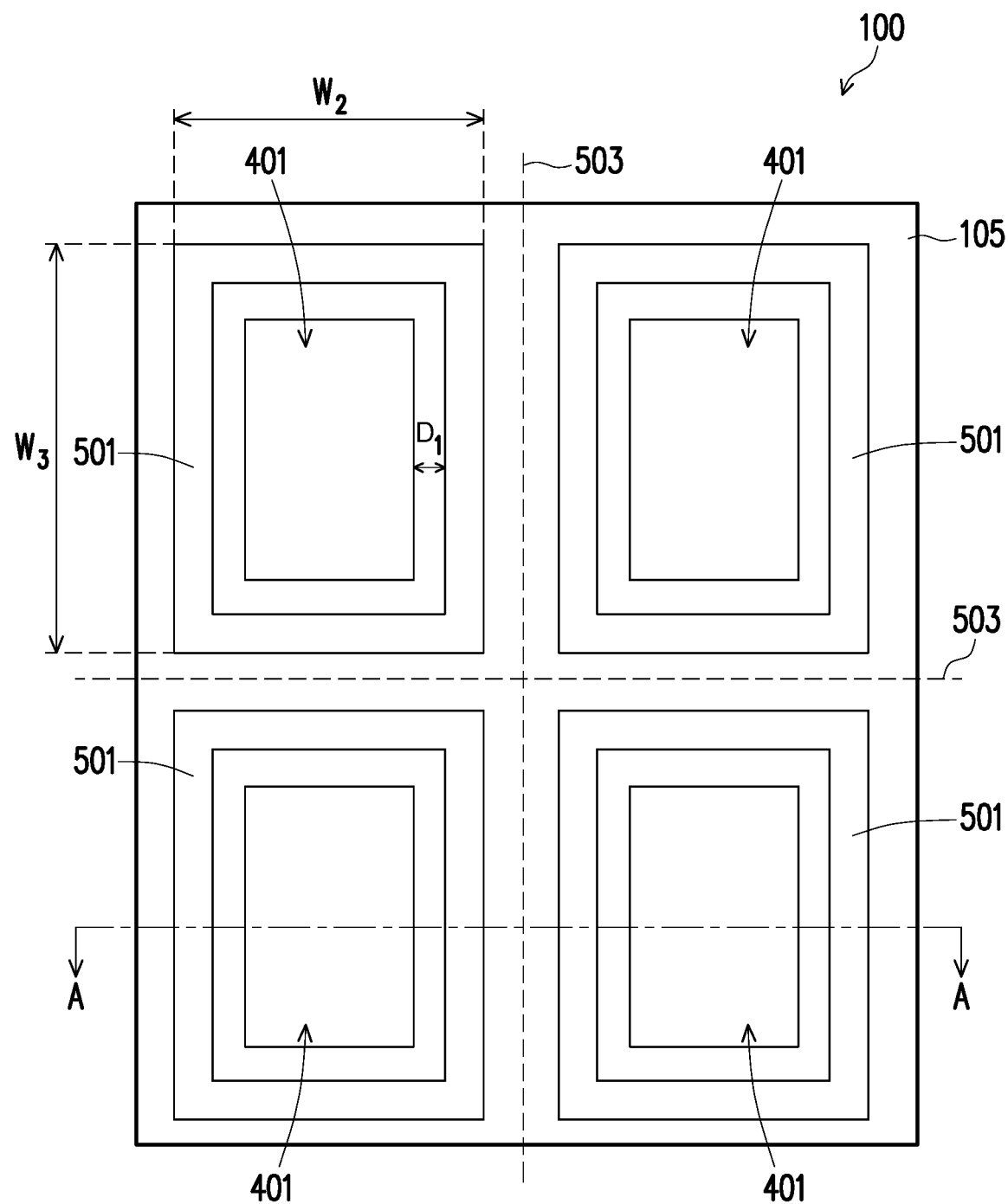
Figure 5B:
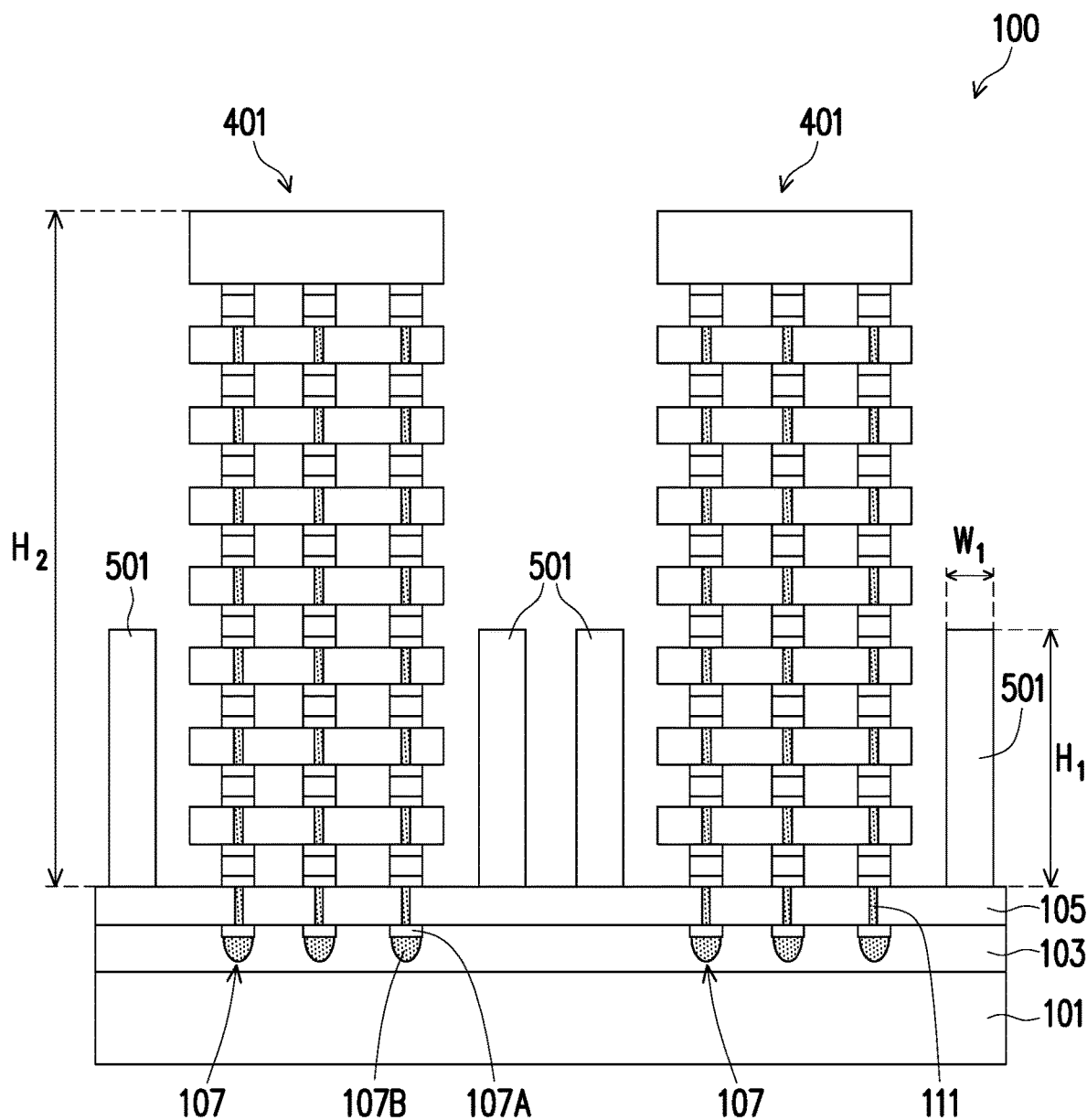

FIGS. 5A and 5B illustrate the formation dam structures 501 around the bonded die stacks 401. FIG. 5A illustrates a top view. FIG. 5B illustrates a cross-sectional view along a line AA shown in FIG. 5A. FIGS. 5A and 5B show the bonded die stacks 401 attached to the wafer 105 and separated from each other by scribe lines 503 of the wafer 105. In some embodiments, the dam structures 501 are annular structures that surround respective bonded die stacks 401. In some embodiments, the dam structures 501 are within areas of the wafer 105 separated by the scribe lines 503. In some embodiments, the dam structures 501 do not overlap with the scribe lines 503. In some embodiments, each of the dam structures 501 may comprise metallic materials, polymer materials, dielectric materials, insulating materials, combinations thereof, or the like. In some embodiments, a material of the dam structures 501 is formed over exposed portions of the wafer 105 and subsequently patterned to form dam structures 501. In some embodiments, the patterning process may include suitable photolithography and etching processes. In other embodiments, the dam structures 501 may be formed using a printing process, a lamination process, a dispensing process, a combination thereof, or the like. In some embodiments, the dam structures 501 have a height $H_1$ and a width $W_1$ in a cross-section illustrated in FIG. 5B. In some embodiments, the height $H_1$ of the dam structures 501 is less than a height $H_2$ of the bonded die stacks 401. In some embodiment, the height $H_1$ is between about 20 μm and about 1000 μm. In some embodiment, the height $H_2$ is between about 50 μm and about 1000 μm. In some embodiment, the width $W_1$ is between about 50 μm and about 1000 μm. In some embodiment, a ratio of $H_1/H_2$ is between about 0.1 and about 2. In some embodiment, a ratio of $H_1/W_1$ is between about 0.1 and about 10.

Figure 6:
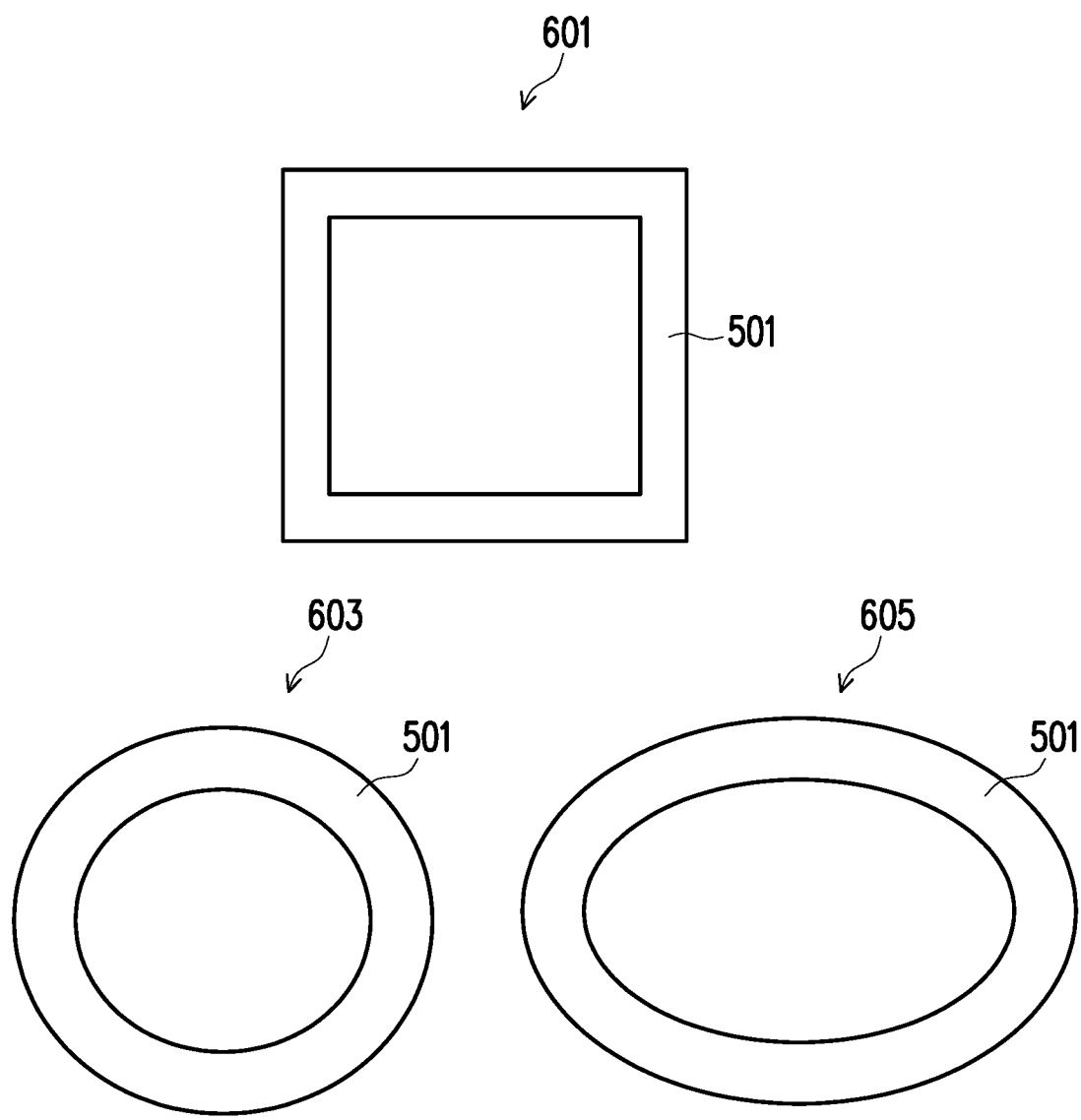

In the embodiment illustrated in FIG. 5A, a plan-view shape of each of the dam structures 501 is a rectangular annular shape. In some embodiments, an outer perimeter of the rectangular annular shape has a first width $W_2$ between about 5 mm and about 50 mm and a second width $W_3$ between about 5 mm and about 50 mm. In some embodiments, a ratio of $W_2/W_3$ is between about 0.1 and about 10. In some embodiments, a distance $D_1$ between the rectangular annular shape and the respective one of the die stacks 401 is between about 50 μm and about 2000 μm. In other embodiments, a plan-view shape of each of the dam structures 501 may be a square annular shape 601, a circular annular shape 603, an elliptical annular shape 605, or the like as illustrated in FIG. 6. In some embodiments, plan-view shapes of the dam structures 501 may be adjusted based on plan-view shapes of the bonded die stacks 401.

Figure 7:
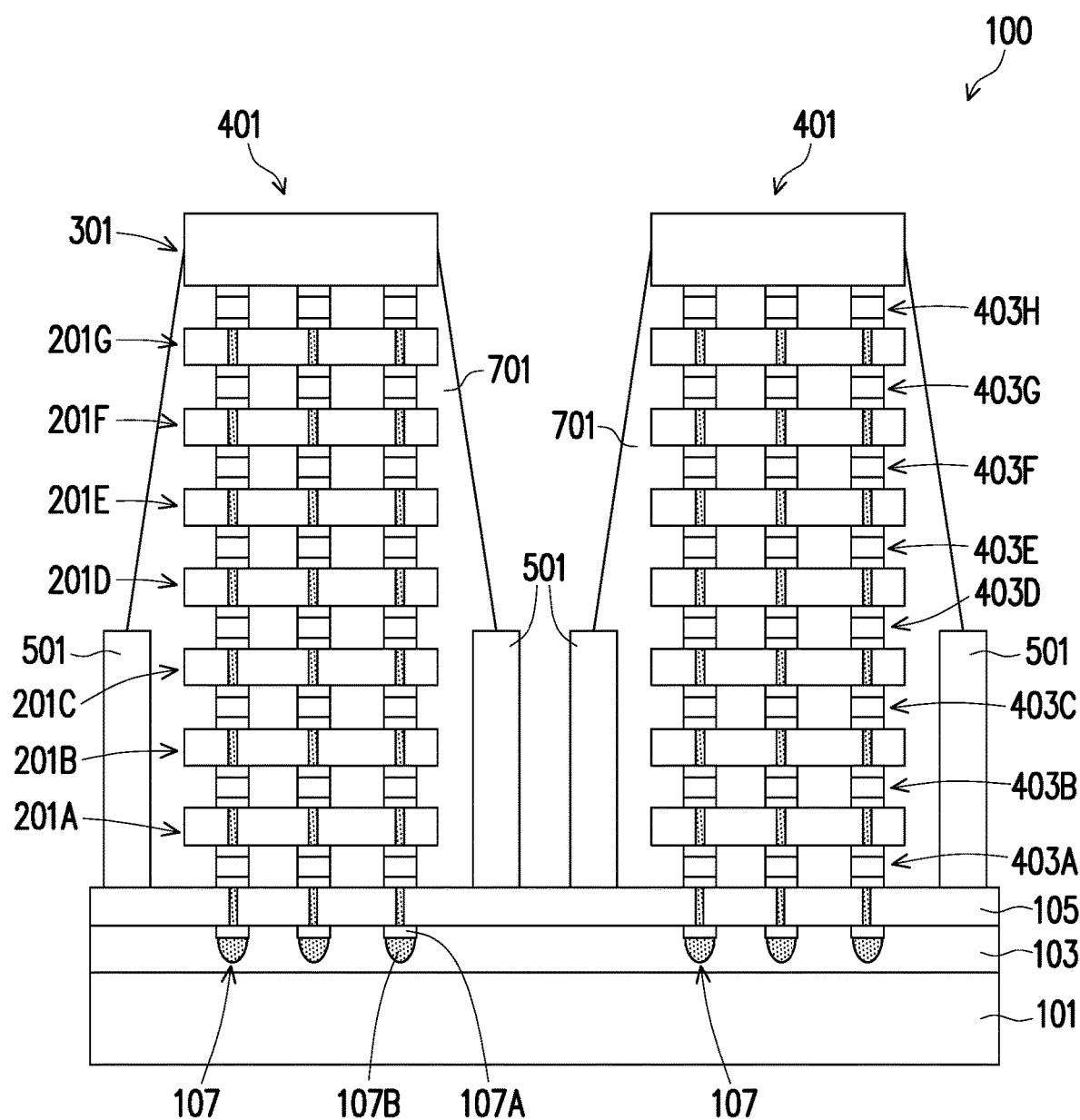

Referring to FIG. 7, after forming the dam structures 501 around the bonded die stacks 401, an underfill 701 is formed in openings of the dam structures 501 and around the die stacks 401. In some embodiments, the underfill 701 is further formed in gaps between adjacent ones of the IC dies 201A-201G and 301 of the bonded die stacks 401 and in gaps between the IC dies 201A and the wafer 105. The underfill 701 surrounds and protects the connector joints 403A-403H. In some embodiments, a liquid underfill material is dispensed by capillary action and cured to form the underfill 701. In some embodiments, the underfill 701 includes an epoxy-based resin with fillers dispersed therein. The fillers may include fibers, particles, other suitable elements, a combination thereof, or the like. In some embodiments, by forming the dam structures 501, lateral spreading of the underfill 701 is contained, which improves gap-filling properties of the underfill 701. In some embodiments, material properties of the underfill 701 may be further altered to improve the gap-filling properties of the underfill 701. In some embodiment, size of the fillers dispersed in an underfill material of the underfill 701 may be reduced. In some embodiment, an underfill material of the underfill 701 may be chosen to have a glass transition temperature $T_g$ between about 40° C. and about 200° C. In some embodiment, an underfill material of the underfill 701 may be chosen to have a coefficient of thermal expansion (CTE) between about 5 ppm/° C. and about 50 ppm/° C. In some embodiment, an underfill material of the underfill 701 may be chosen to have a Young's Modulus between about 0.1 GPa and about 20 GPa. In the illustrated embodiment, the dam structures 501 prevent the underfill 701 from forming a continuous layer over the wafer 105, which may prevent warpage of the wafer 105 due to mismatch of CTEs and, as a consequence, may reduce or prevent joint failure of the connector joints 403A-403H. In some embodiments, the underfill 701 has sloped sidewalls.

Referring to FIG. 8, after forming the underfill 701, an encapsulant 801 is formed over the wafer 105 and surrounding the die stacks 401 and the dam structures 501. In some embodiments, the encapsulant 801 may comprise a molding compound, such as an epoxy, a resin, a moldable polymer, a combination thereof, or the like, with fillers dispersed therein. The molding compound may be applied while substantially liquid, and then may be cured through a chemical reaction. The fillers may include insulating fibers, insulating particles, other suitable elements, a combination thereof, or the like. In some embodiments, the encapsulant 801 may be formed using similar materials and methods as the underfill 701 described above with reference to FIG. 7 and the description is not repeated herein. In some embodiments, the encapsulant 801 and the underfill 701 comprise a same material. In some embodiments, the encapsulant 801 and the underfill 701 comprise different materials. In some embodiments, the size and/or density of the fillers dispersed in the encapsulant 801 is greater than those dispersed in the underfill 701. In other embodiments, the encapsulant 801 may be an ultraviolet (UV) or thermally cured polymer applied as a gel or malleable solid capable of being disposed around and between the die stacks 401 and the dam structures 501. In yet other embodiments, the encapsulant 801 may comprise a dielectric material, such as an oxide, for example. In some embodiments, a planarization process may be performed on the encapsulant 801 to remove excess portions of the encapsulant 801, such that a topmost surface of the encapsulant 801 is substantially level with topmost surfaces of the die stacks 401. In some embodiments, the planarization process may also remove upper portions of the IC dies 301 and thin the IC dies 301. In some embodiments, the planarization process may comprise a CMP process, an etching process, grinding, a combination thereof, or the like.

Referring to FIG. 9, after forming the encapsulant 801, the carrier 101 is de-bonded from the wafer-level die structure 100. In some embodiments, after de-bonding the carrier 101 from the wafer-level die structure 100, the adhesive layer 103 is also removed to expose the connectors 107. In some embodiments, the adhesive layer 103 may be removed using a suitable cleaning process.

Referring to FIG. 10, after de-bonding the carrier 101 from the wafer-level die structure 100, the wafer-level die structure 100 is singulated along the scribe lines 503 (see FIG. 5A) to form individual IC packages 1001. In some embodiments, each of the IC packages 1001 includes a bonded die stack 401 and a corresponding dam structure 501. In some embodiments, the wafer-level die structure 100 may be singulated into individual IC packages 1001, for example, by sawing, laser ablation, etching, a combination thereof, or the like.

Figure 11:
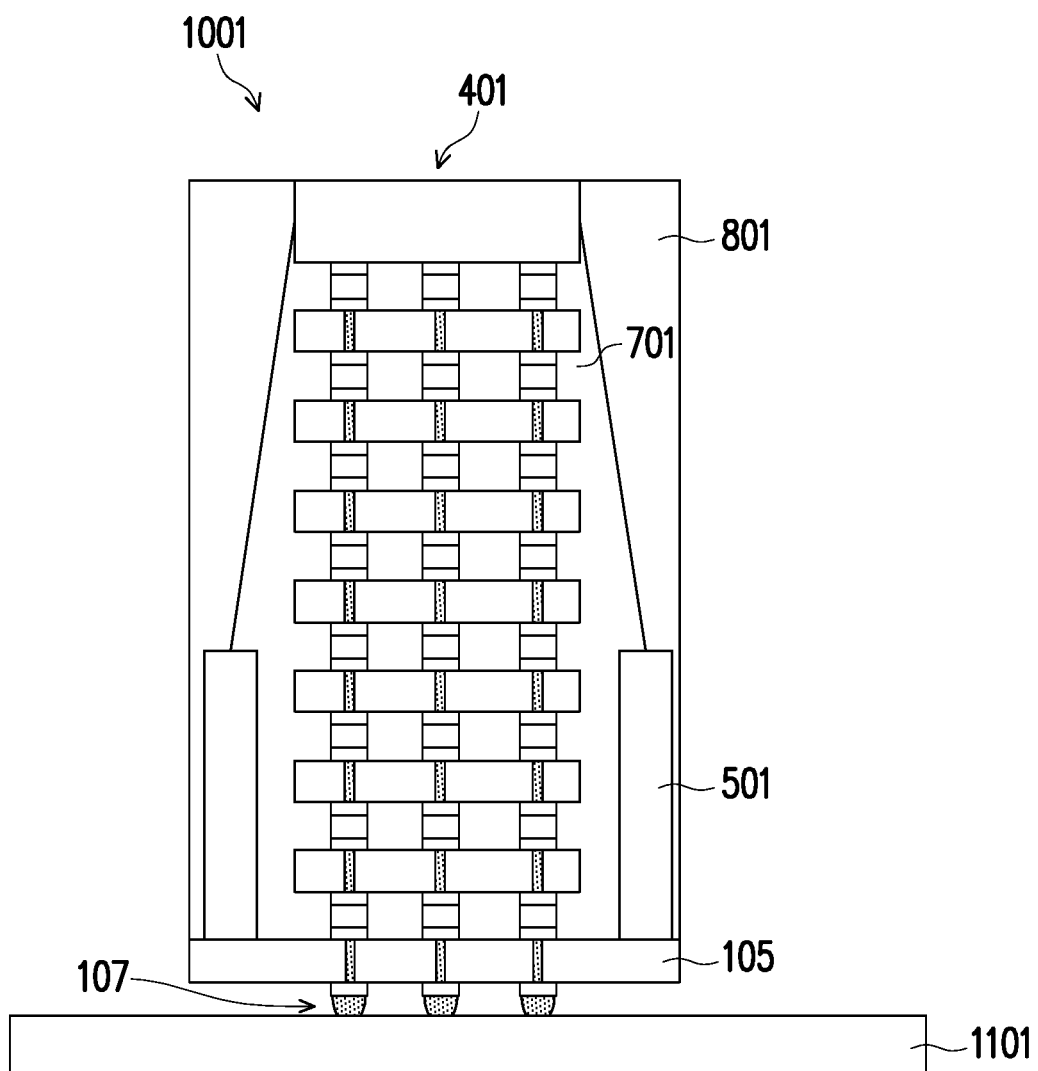

Referring to FIG. 11, in some embodiments, an IC package 1001 is mechanically and electrically attached to a workpiece 1101 using the connectors 107. In some embodiments, a reflow process may be performed to bond the IC package 1001 to the workpiece 1101. In some embodiments, the workpiece 1101 may comprise an integrated circuit die, a package substrate, a printed circuit board (PCB), a ceramic substrate, or the like.

Figure 12:
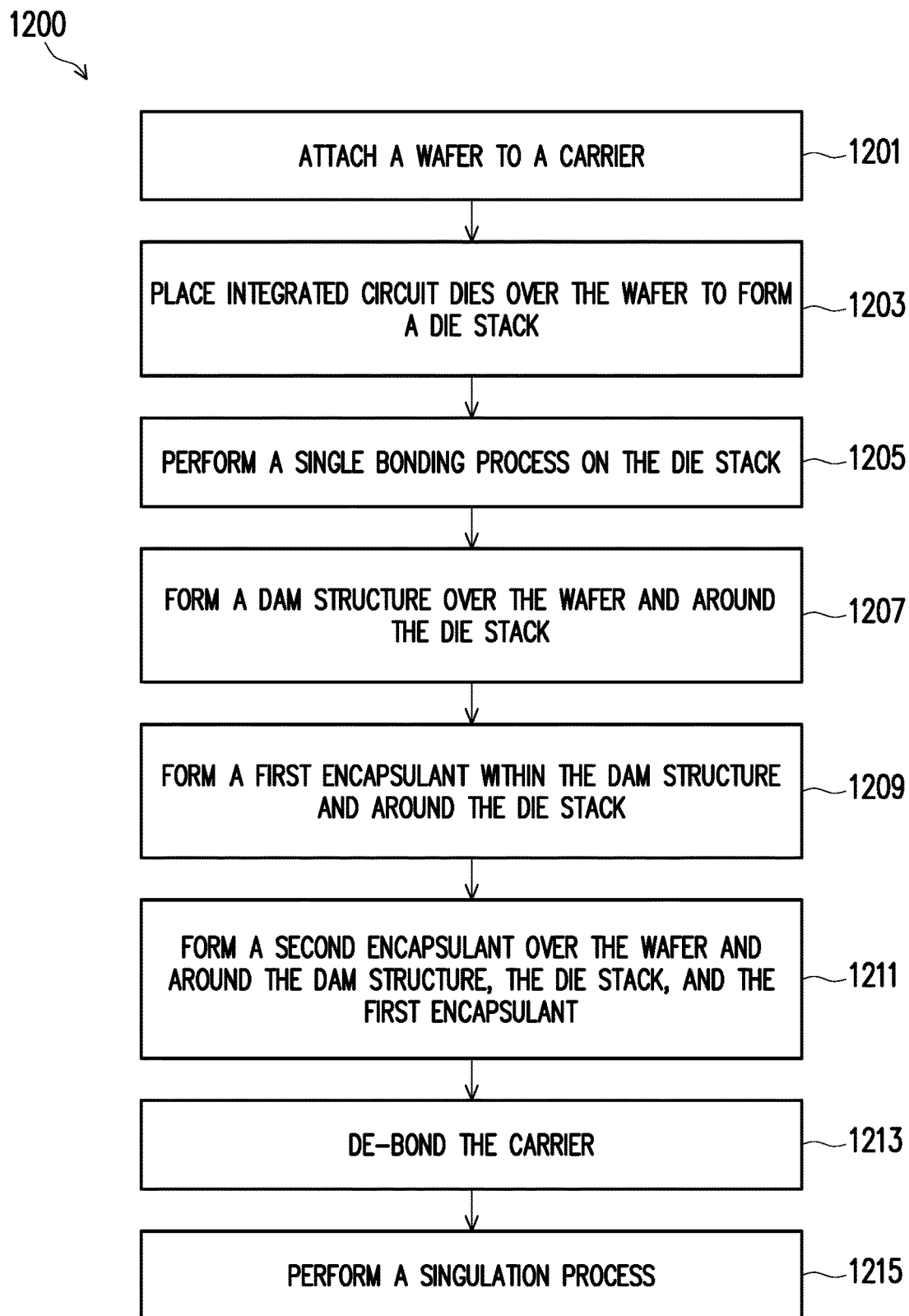
FIG. 12 is a flow diagram illustrating a method of forming of integrated circuit packages in accordance with some embodiments.

FIG. 12 is a flow diagram illustrating a method 1200 of forming of integrated circuit packages in accordance with some embodiments. The method starts with step 1201, where a wafer (such as, for example, the wafer 105 illustrated in FIG. 1) is attached to a carrier (such as, for example, the carrier 101 illustrated in FIG. 1) as described above with reference to FIG. 1. In step 1203, integrated circuit dies (such as, for example, the IC dies 201A-201G and 301 illustrated in FIG. 3) are placed on the wafer to form a die stack (such as, for example, the die stack 305 illustrated in FIG. 3) as described above with reference to FIGS. 2 and 3. In step 1205, a single bonding process is performed on the die stack as described above with reference to FIG. 4. In step 1207, a dam structure (such as, for example, the dam structure 501 illustrated in FIG. 5) is formed over the wafer and around the die stack as described above with reference to FIGS. 5A and 5B. In step 1209, a first encapsulant (such as, for example, the underfill 701 illustrated in FIG. 7) is formed within the dam structure and around the die stack as described above with reference to FIG. 7. In step 1211, a second encapsulant (such as, for example, the encapsulant 801 illustrated in FIG. 8) is formed over the wafer and around the dam structure, the die stack, and the first encapsulant as described above with reference to FIG. 8. In step 1213, the carrier is de-bonded from a resulting structure (such as, for example, the wafer-level die structure 100 illustrated in FIG. 9) as described above with reference to FIG. 9. In step 1215, the resulting structure is singulated into individual integrated circuit packages (such as, for example, the IC packages illustrated in FIG. 10) as described above with reference to FIG. 10.

In accordance with an embodiment, a method includes: stacking a plurality of integrated circuit dies on a wafer to form a die stack; performing a bonding process on the die stack, the bonding process mechanically and electrically connecting adjacent integrated circuit dies of the die stack to each other; forming a dam structure over the wafer, the dam structure surrounding the die stack; forming a first encapsulant over the wafer and between the die stack and the dam structure, the first encapsulant filling gaps between the adjacent integrated circuit dies of the die stack; and forming a second encapsulant over the wafer, the second encapsulant surrounding the die stack, the first encapsulant and the dam structure. In an embodiment, the method further includes, before stacking the plurality of integrated circuit dies on the wafer, attaching the wafer to a carrier. In an embodiment, performing the bonding process includes performing a solder reflow process. In an embodiment, stacking the plurality of integrated circuit dies on the wafer includes dipping each of the plurality of integrated circuit dies in a flux material before placing each of the plurality of integrated circuit dies on the wafer. In an embodiment, performing the bonding process on the die stack includes forming a plurality of connector joints between the adjacent integrated circuit dies of the die stack. In an embodiment, the dam structure is an annular structure. In an embodiment, the die stack and the first encapsulant are disposed in an opening of the dam structure.

In accordance with another embodiment, a method includes: placing a first integrated circuit die on a wafer, the wafer including first connectors on a first side of the wafer, the first integrated circuit die including second connectors on a first side of the first integrated circuit die and third connectors on a second side of the first integrated circuit die, the first side of the first integrated circuit die being opposite the second side of the first integrated circuit die, the first connectors being in contact with the second connectors; placing a second integrated circuit die on the first integrated circuit die, the second integrated circuit die including fourth connectors on a first side of the second integrated circuit die and fifth connectors on a second side of the second integrated circuit die, the first side of the second integrated circuit die being opposite the second side of the second integrated circuit die, the third connectors being in contact with the fourth connectors; performing a bonding process on the first integrated circuit die and the second integrated circuit die, the bonding process bonding the first connectors and the second connectors to form first connector joints, the bonding process bonding the third connectors and the fourth connectors to form second connector joints; forming a dam structure over the wafer, the dam structure surrounding the first integrated circuit die and the second integrated circuit die; forming a first encapsulant over the wafer and around the first connector joints and the second connector joints; and forming a second encapsulant over the wafer, the second encapsulant surrounding the first integrated circuit die, the second integrated circuit die, the first encapsulant and the dam structure. In an embodiment, performing the bonding process includes performing a solder reflow process on the first connectors, the second connectors, the third connectors and the fourth connectors. In an embodiment, the bonding process merges a first solder layer of each of the first connectors with a second solder layer of a respective one of the second connectors to form a first single solder layer. In an embodiment, the bonding process merges a third solder layer of each of the third connectors with a fourth solder layer of a respective one of the fourth connectors to form a second single solder layer. In an embodiment, the method further includes, before placing the first integrated circuit die on the wafer, dipping the first integrated circuit die in a flux material. In an embodiment, the method further includes, before placing the second integrated circuit die on the wafer, dipping the second integrated circuit die in the flux material. In an embodiment, a first sidewall of the dam structure is in contact with the first encapsulant, a second sidewall of the dam structure is in contact with the second encapsulant, and the first sidewall of the dam structure is opposite the second sidewall of the dam structure.

In accordance with yet another embodiment, a package includes: a substrate; a dam structure over the substrate, the dam structure being an annular structure; a die stack over the substrate and within an opening of the dam structure, the die stack including a plurality of integrated circuit dies and connector joints between adjacent integrated circuit dies of the plurality of integrated circuit dies; a first encapsulant extending along sidewalls of the plurality of integrated circuit dies, the first encapsulant surrounding the connector joints; and a second encapsulant surrounding the die stack, the first encapsulant and the dam structure. In an embodiment, the first encapsulant fills the opening of the dam structure. In an embodiment, a first sidewall of the dam structure is in contact with the first encapsulant, a second sidewall of the dam structure is in contact with the second encapsulant, and the first sidewall of the dam structure is opposite the second sidewall of the dam structure. In an embodiment, the first encapsulant has sloped sidewalls. In an embodiment, a topmost surface of the die stack is level with a topmost surface of the second encapsulant. In an embodiment, a sidewall of the second encapsulant is coplanar with a sidewall of the substrate.

In accordance with yet another embodiment, a package includes: a substrate; a dam structure attached to the substrate, the dam structure being an annular structure; a die stack within a hole of the dam structure and attached to the substrate, a height of the die stack being greater than a height of the dam structure; a first encapsulant filling the hole of the dam structure; and a second encapsulant surrounding the die stack, the first encapsulant and the dam structure.

In accordance with yet another embodiment, a package includes: a substrate; a die stack bonded to the substrate, the die stack including a plurality of integrated circuit dies, wherein each pair of adjacent integrated circuit dies of the plurality of integrated circuit dies are electrically and mechanically coupled to one another by connector joints; a first encapsulant extending along sidewalls of the plurality of integrated circuit dies and sidewalls of the connector joints; a second encapsulant surrounding the die stack and the first encapsulant; and a dam structure embedded within the first encapsulant and the second encapsulant, wherein the dam structure encircles the die stack, wherein the first encapsulant extends along a first sidewall and a top surface of the dam structure, wherein the second encapsulant extends along a second sidewall and the top surface of the dam structure, and wherein the first sidewall of the dam structure is opposite to the second sidewall of the dam structure.

In accordance with yet another embodiment, a method includes: stacking a plurality of integrated circuit dies on a wafer to form a die stack; performing a bonding process on the die stack, wherein the bonding process mechanically and electrically connects adjacent integrated circuit dies of the die stack to each other; attaching a dam structure to the wafer, the die stack extending through a hole in the dam structure; filling the hole in the dam structure with a first encapsulant, wherein the first encapsulant further fills gaps between the adjacent integrated circuit dies of the die stack; and forming a second encapsulant over the wafer, wherein the second encapsulant extends along a sidewall of the first encapsulant and along a sidewall and a top surface of the dam structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a substrate;
a dam structure attached to the substrate, the dam structure being an annular structure;
a die stack within a hole of the dam structure and attached to the substrate, a height of the die stack being greater than a height of the dam structure;
a first encapsulant filling the hole of the dam structure; and
a second encapsulant surrounding the die stack, the first encapsulant and the dam structure.

2. The package of claim 1, wherein the first encapsulant is in physical contact with a first sidewall of the dam structure, wherein the second encapsulant is in physical contact with a second sidewall of the dam structure, and wherein the first sidewall of the dam structure is opposite to the second sidewall of the dam structure.

3. The package of claim 1, wherein an interface between the first encapsulant and the second encapsulant is in physical contact with a top surface of the dam structure.

4. The package of claim 1, wherein the first encapsulant has a sloped sidewall, and wherein the sloped sidewall of the first encapsulant extends from a sidewall of the die stack to a top surface of the dam structure.

5. The package of claim 1, wherein a top surface of the die stack is level with a top surface of the second encapsulant.

6. The package of claim 1, wherein the die stack comprises a plurality of dies, and wherein the first encapsulant extends between adjacent ones of the plurality of dies.

7. The package of claim 1, wherein the dam structure is within a perimeter of the substrate in a plan view.

8. A package comprising:
a substrate;
a die stack bonded to the substrate, the die stack comprising a plurality of integrated circuit dies, wherein each pair of adjacent integrated circuit dies of the plurality of integrated circuit dies are electrically and mechanically coupled to one another by connector joints;
a first encapsulant extending along sidewalls of the plurality of integrated circuit dies and sidewalls of the connector joints;
a second encapsulant surrounding the die stack and the first encapsulant; and
a dam structure embedded within the first encapsulant and the second encapsulant, wherein the dam structure encircles the die stack, wherein the first encapsulant extends along a first sidewall and a top surface of the dam structure, wherein the second encapsulant extends along a second sidewall and the top surface of the dam structure, and wherein the first sidewall of the dam structure is opposite to the second sidewall of the dam structure.

9. The package of claim 8, wherein the dam structure comprises a hole, and wherein the die stack is disposed within the hole.

10. The package of claim 9, wherein the first encapsulant overfills the hole in the dam structure.

11. The package of claim 8, wherein an interface between the first encapsulant and the second encapsulant is in physical contact with a sidewall of a topmost integrated circuit die of the die stack.

12. The package of claim 8, wherein the dam structure has a first height, wherein the die stack has a second height, and wherein a ratio of the first height to the second height is between about 0.1 and about 2.

13. The package of claim 8, wherein the dam structure has a first height and a first width, and wherein a ratio of the first height to the first width is between about 0.1 and about 10.

14. The package of claim 8, wherein the second encapsulant does not extend along a topmost surface of the die stack.

15. A method comprising:
stacking a plurality of integrated circuit dies on a wafer to form a die stack;
performing a bonding process on the die stack, wherein the bonding process mechanically and electrically connects adjacent integrated circuit dies of the die stack to each other;
attaching a dam structure to the wafer, the die stack extending through a hole in the dam structure;
filling the hole in the dam structure with a first encapsulant, wherein the first encapsulant further fills gaps between the adjacent integrated circuit dies of the die stack; and forming a second encapsulant over the wafer, wherein the second encapsulant extends along a sidewall of the first encapsulant and along a sidewall and a top surface of the dam structure.

16. The method of claim 15, wherein stacking the plurality of integrated circuit dies on the wafer comprises dipping each of the plurality of integrated circuit dies in a flux material before placing each of the plurality of integrated circuit dies on the wafer.

17. The method of claim 15, wherein performing the bonding process comprises performing a solder reflow process.

18. The method of claim 15, wherein the first encapsulant and the second encapsulant comprise different materials.

19. The method of claim 15, wherein the first encapsulant has a coefficient of thermal expansion (CTE) between about 5 ppm/° C. and about 50 ppm/° C.

20. The method of claim 15, wherein a distance between the dam structure and the die stack is between about 50 μm and about 2000 μm.

* * * * *